US005224264A

United States Patent [19]

Takahashi et al.

[11] Patent Number: 5,224,264

[45] Date of Patent: Jul. 6, 1993

[54] PROCESS FOR PRODUCING A FILM CARRIER HAVING A SUPERIOR LEAD STRENGTH

[75] Inventors: Akio Takahashi, Chibashi; Shigenori Tokunaga, Ichiharashi; Hidenori Furukawa, Ichiharashi; Haruo Kato, Ichiharashi, all of Japan

[73] Assignee: Chisso Corporation, Osaka, Japan

[21] Appl. No.: 862,298

[22] Filed: Apr. 2, 1992

[30] Foreign Application Priority Data

Apr. 4, 1991 [JP] Japan .................................. 3-99645

[51] Int. Cl.$^{5}$ ............................................ H01R 43/00

[52] U.S. Cl. .................................... 29/827; 179/52.4; 437/206

[58] Field of Search ................ 29/827; 174/52.4, 52.2; 437/206, 209

[56] References Cited

U.S. PATENT DOCUMENTS 3,984,739 10/1976 Mochizuki et al. ............ 174/52.4 X
4,756,080 7/1988 Thorp, Jr. et al. ................... 29/827
4,812,421 3/1989 Jung et al. ............................ 29/827
5,112,694 5/1992 Konotsune et al. .

FOREIGN PATENT DOCUMENTS 55-30859 3/1980 Japan .................................. 437/206
64-1247 1/1989 Japan .................................. 437/206
1-128532 5/1989 Japan .................................. 437/206
2-69951 3/1990 Japan .
2-82546 3/1990 Japan .

*Primary Examiner*—Carl J. Arbes
*Attorney, Agent, or Firm*—Leydig, Voit & Mayer

[57] ABSTRACT

A process for producing a film carrier having a superior lead strength, which comprises removing from a film carrier body of a two-layer structure consisting of a metal conductor layer and an organic resin insulating layer snch as a polyimide resin layer, a definite portion of the organic resin insulating layer, or alternatively removing from a film carrier body of a three-layer structure consisting of a metal conductor layer, an organic resin insulating layer and an adhesive layer therebetween, definite portions of the organic resin insulating layer and the adhesive layer, by means of a cutting machine, to form an opening part, and also cutting a portion of the metal conductor layer under the opening part, to reduce the thickness of the metal conductor layer.

4 Claims, 3 Drawing Sheets k h

PROCESS FOR PRODUCING A FILM CARRIER HAVING A SUPERIOR LEAD STRENGTH

BACKGROUND OF THE INVENTION

1. Field of the Invention

This invention relates to a film carrier used for semiconductor devices, etc., and produced according to T.A.B. (Tape Automated Bonding) method.

2. Description of the Related Art

As a mounting method suitable for making recently notably advanced semiconductor devices, highly functional, imparting a high performance thereto and making them thinner and smaller, the above-mentioned T.A.B. method using a film carrier has been noted, and its details have been described, for example, in "Guide to TAB Technique" (author: Kenzo Hatada) published by Industrial Research Association Co., Ltd. on Jan. 25, 1990, etc.

As shown in FIGS. 1(A), 1(B) and 1(C), the film carrier is provided on an insulating layer having definite opening parts consisting of a device hole (f) for fitting a semiconductor chip, outer lead holes (c) for taking out leads (outer leads) for connecting to the outside part of a T.A.B. mounting semiconductor device, etc., with a metal conductor layer wiring pattern consisting of finger-form inner leads (e), protruded into the device hole and for connecting to the semiconductor chip, outer leads (d) for connecting to the outside, inspection pads (b) for inspecting the characteristics of the T.A.B. mounting semiconductor device, etc. In addition, (a) refers to sprocket holes.

As shown in FIGS. 2(A), 2(B) and 2(C), the T.A.B. method is carried out by arranging the semiconductor chip inside the device hole of the film carrier, registering the finger-form inner leads protruded into the inside of the device hole with the projected electrode (k) formed on the semiconductor chip electrode, carrying out I.L.B. (Inner Lead Bonding) for connecting the both according to a process of heat contact bonding or the like, carrying out resin-sealing for protecting the semiconductor chip, separating off the accepted product after inspection along the cut lines (i) by means of punching or the like, and connecting and mounting the outer leads onto a printed wiring sheet or the like by means of soldering, an anisotropic electrically conductive resin, or the like.

In recent years, with high integration and high densification of semiconductor devices, particularly, pin-multiplication and pitch-narrowing of wiring patterns, including finger-form inner leads protruding into the device hole, have been remarkably required.

Any of such metal conductor layer wiring patterns including inner leads have been obtained by treating the metal conductor layer adhered directly or by the medium of an adhesive layer, onto an insulating layer of polyimide resin layer or the like of the film layer body, according to a lithographic technique or an etching technique.

As shown in FIG. 3, the etching of the metal conductor layer at the resist pattern formed according to a lithographic technique is in the form of being broader at the upper part and narrower toward the lower part; hence the cross-section of the metal conductor layer wiring patterns shows a trapezoidal form in which the top part is narrower and the bottom part is broader.

In order to correspond to pitch-narrowing for reducing the distance between the respective wirings, it is necessary to reduce the width of the wirings and also use a thin metal conductor layer for preventing the shortcircuit between the wiring patterns at the bottom part of the wiring patterns.

However, since the wiring patterns at the part adhered directly or by the medium of an adhesive onto the insulating layer are reinforced by the insulating layer, the strength of the patterns raises no problem, but on the other hand, there is raised an inconsistent requirement that a thick metal conductor layer is required for the purpose that the inner leads and the outer leads formed inside the definite opening parts endure the heat and force applied at the time of the above-mentioned I.L.B., at the time of resin sealing and at the time of connecting and mounting onto the printed wiring sheet, thermal stress generated at the time of use of the semiconductor devices, etc. to thereby maintain and improve the strength and prevent the leads from breaking.

As processes for solving the above inconsistency, there are a process of retaining only the metal conductor layer forming the inner lead parts, in a relatively thick manner, and a process of using an alloy of a high strength, as the material constituting the metal conductor layer.

Japanese patent application laid-open No. Hei 2-69,951 discloses a process of relatively thickening only the metal conductor layer forming the inner lead part. According to this process, even when the thickness of the metal conductor layer inside the device hole has been relatively increased, the shortcircuit at the bottom part of the wiring pattern at the time of patterning by means of etching is solved by adjusting the shape by means of soft etching or the like at the subsequent pretreating step of gold- or tin-plating treatment to thereby prevent the shortcircuit, but the following two problems are raised:

The first problem consists in that as a process of ensuring the thickness of the metal conductor layer forming the inner lead part, and reducing the thickness of the metal conductor layer at other parts, it is necessary to carry out a selective etching treatment before or after the patterning, but such a selective etching is so long step and requires a lithographc step which is economically inferior.

The second problem consists in that while it is possible to adjust the shape of the bottom part of the inner leads inside the device hole by means of soft etching which is a pretreatment step of gold- or tin-plating treatment, the bottom part of the joint part of the inner leads outside the device hole is not sufficiently treated so hat prevention of a short-circuit between the wiring patterns remains unsolved.

Further, Japanese patent application laid-open No. Hei 2-82,546 discloses a process of using as a material constituting the metal conductor layer, a calendered copper foil containing 10% or less of impurities and having a thickness of 20 μm or less, but this process raises the following two problems:

The first problem consists in that the calendered foil is different in the percentage of calendering, crystalline structure, etc., between the direction in which the calendering treatment has been applied onto the foil and the direction perpendicular to the above so that various values of physical properties of the foil such as coefficient of thermal expansion, etching characteristics, etc. exhibit directional properties; hence the designs of the film carrier such as arrangement of wiring patterns, etc. are restricted.

The second problem consists in that since the calendered copper foil is produced according to a specific technique of calendering, differently from electrolytic copper foil most used as a metal conductor foil for the film carrier, its production cost is twice or more that of the electrolytic copper foil, and also the alloy foil itself is specific and its cost is higher than those of general foils; hence the above process of using alloy-calendered copper foil is higher in the cost.

The present invention has been made in such a background, and its object is to provide a process for producing a film carrier having a sufficient lead strength, without employing lithographic steps being long, economically inferior and cumbersome, without using an alloy-calendered copper foil accompanied by restriction to the design of the film carrier and higher in cost, and by forming a metal conductor layer of a small thickness causing no shortcircuit between wiring patterns.

In order to achieve the above object, the present inventors have made extensive research in a process for forming a metal conductor layer of a small thickness which avoids a shortcircuit between wiring patterns, while retaining and improving the strength of the wiring leads, particularly inner leads, outer leads, etc. formed inside definite opening parts and without being reinforced by the insulating layer.

As a result, the present inventors have found that when a definite portion of the insulating layer, etc. of the film carrier body is removed by means of a cutting machine to form a definite opening part, and at the same time, a portion of the metal conductor layer as the lower layer of the definite opening part is also removed by cutting to reduce its thickness, then the break strength of the metal conductor layer per unit cross-sectional area is improved.

SUMMARY OF THE INVENTION

The present invention has the following constitutions (1) and (2):

(1) A process for producing a film carrier having a superior lead strength, which comprises removing from the body of a film carrier of a two-layer structure consisting of a metal conductor layer and an organic resin insulating layer, a definite portion of said insulating layer by means of a cutting machine to form an opening part, and at the same time, cutting a portion of said metal conductor layer as the lower layer of said opening part to reduce the thickness of said metal conductor layer of the lower layer of the opening part.

(2) A process for producing a film carrier having a superior lead strength according to item (1), wherein said organic resin insulating layer is a polyimide resin insulating layer.

(3) A process for producing a film carrier having a superior lead strength, which comprises removing from the body of a three-layer structure obtained by applying a metal conductor layer onto an organic resin insulating layer by the medium of an adhesive layer, definite portions of said organic resin insulating layer and said adhesive layer as the lower layer of said organic resin insulating layer, by means of a cutting-processing machine to form an opening part, and at the same time, cutting a portion of the lower layer of said metal conductor layer to reduce the thickness of the metal conductor layer of the lower layer of said opening part.

(4) A process for producing a film carrier having a superior lead strength according to item (3), wherein said organic resin insulating layer is a polyimide resin, polyethylene terephthalate resin or glass-reinforced resin insulating layer, and said adhesive layer is an epoxy, urethane, acrylic, methacrylic or isocyanate adhesive layer.

In these figures, a—sprocket hole; b—inspection pad; c—outer lead hole; d—outer lead; e—inner lead; f—device hole; g—insulating layer; h—adhesive layer; i—cut line; j—semiconductor chip; and k—protruded electrode.

Figure 1A:
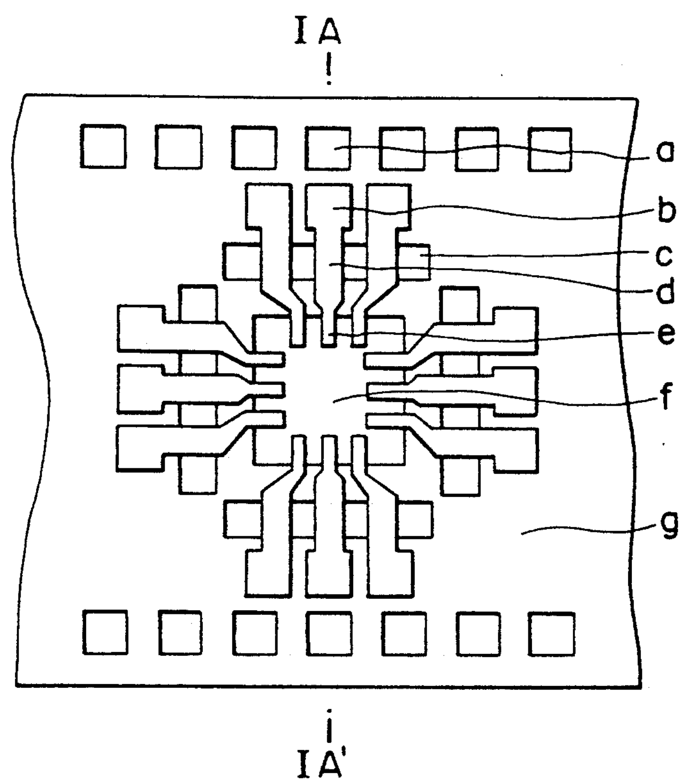
FIG. 1A shows a plan view of a film carrier.
Figure 1B:
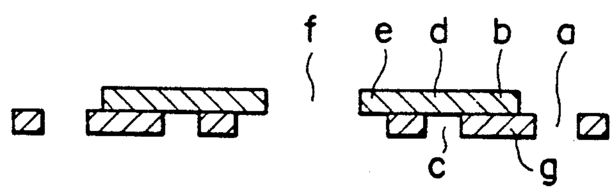
FIG. 1B shows a cross-section of a film, carrier of a two-layer structure cut along line IA—IA'.
Figure 1C:
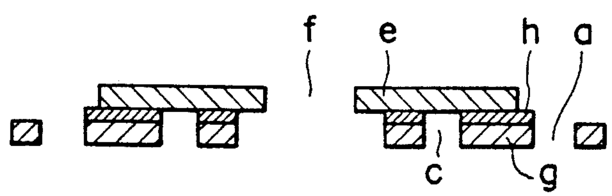
FIG. 1C shows a cross-section of a film carrier of a third layer structure cut along line IA—IA'.
Figure 2A:
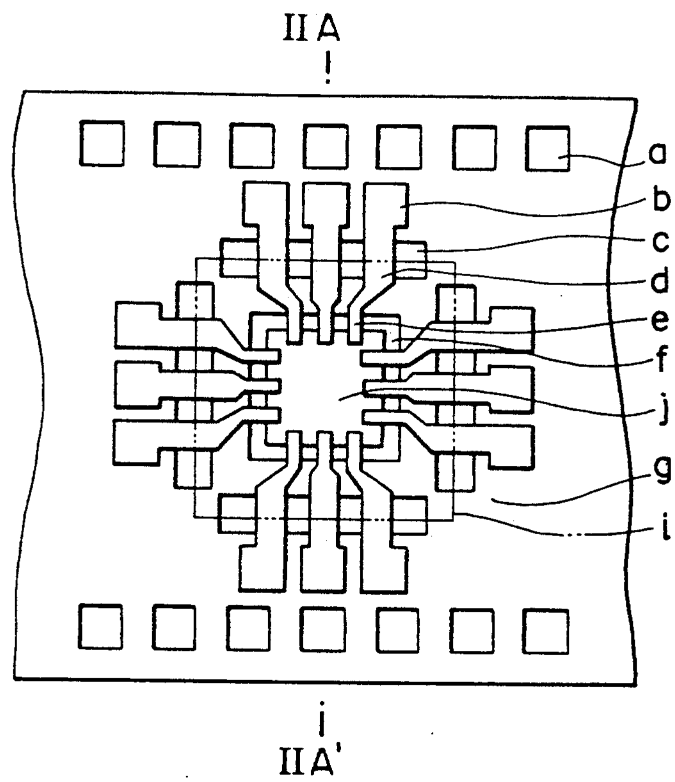
FIG. 2A shows a plan view in the case of inner-lead-bonding a semiconductor chip onto a film carrier.
Figure 2B:
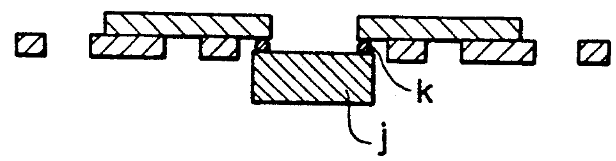
FIG. 2B shows a cross-section along line IIA-IIA', of a film carrier of a two-layer structure.
Figure 2C:
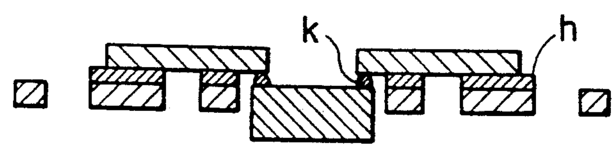
FIG. 2C shows a cross-section along line IIA—IIA', of a film carrier of a three-layer structure.
Figure 3:
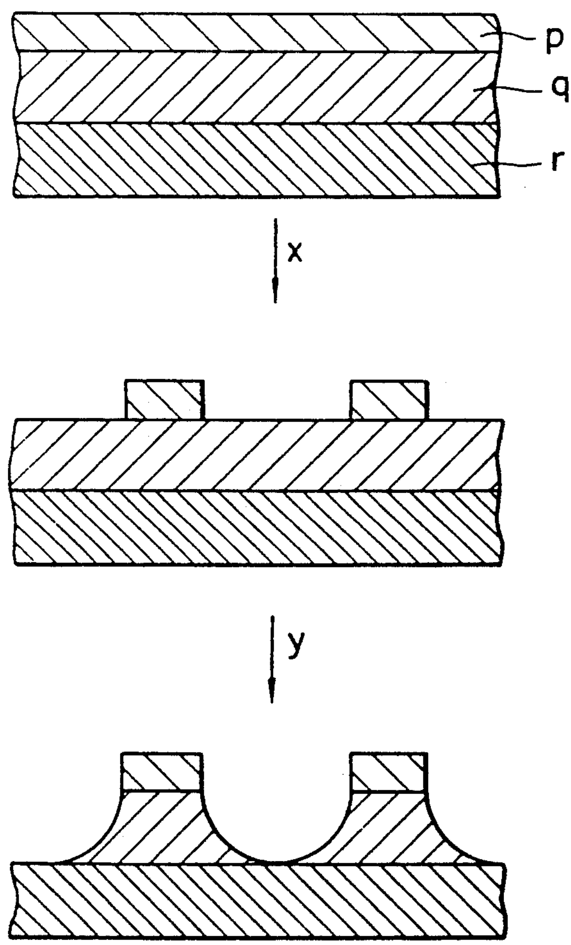

FIG. 3 shows a cross-section of lithography and etching steps at the time of producing a film carrier. In this figure, p—photoresist; q—metal conductor layer; r—insulating layer; x—exposure-development steps; and y—etching step.

DETAILED DESCRIPTION OF PREFERRED EMBODIMENTS

Examples of the material constituting the metal conductor layer described in the above items (1) and (2) are Cu, Al, Au, Ag, Fe, Sn and Pb or alloys of the foregoing or plated materials of the foregoing.

The body of the film carrier of the two-layer structure described in the above item (1), may be, for example, formed by casting a polyimide resin solution or polyimide precursor solution onto a metal conductor layer consisting of the above material, or by subjecting a metal consisting of the above material to vacuum deposition or electrodeposition onto the polyimide resin layer.

Further, a product prepared by laminating a thermoplastic polyimide resin onto a metal conductor layer and a product prepared by adhering a metal conductor layer and a polyimide resin layer using a thermoplastic polyimide resin as an adhesive are exemplified.

Representative examples of the organic resin insulating layer used in the above item (2) are polyimide resins, polyethylene terephthalate resin, glass-reinforced epoxy resins, and besides, polybutylene terephthalate resin, polyparabanic acid resin, polyphenylsulfone resin, polyether imide resins, polyether ketone resins, aramid resins, etc. are exemplified. Further, products obtained by reinforcing these resins with glass fibers, Kevlar fibers, etc. are exemplified.

Examples of the material constituting the adhesive layer used in the above item (2) are epoxy adhesives, urethane adhesives, acrylic or methacrylic adhesives, isocyanate adhesives, etc.

As the cutting machine used in the above items (1) and (2), numerically controllable numerical control robots as a kind of numerical control machine tool, such as servo-controlled robot classified into those of control system, crossed X, Y, Z robot classified into those of operating mechanism, etc. are exemplified.

According to the present invention, a device hole, etc. are opened by cutting definite portions of organic resin insulating layer, etc. consisting of polyimide resin, etc. of the body of the film carrier, and at the same time, a portion of the metal conductor layer as the lower layer thereof is also cut, whereby it is possible to reduce the thickness of the metal conductor layer as the lower layer of the definite portion so as not to cause a shortcircuit between the wiring patterns, and also to retain and improve the strength of the wiring leads even without any reinforcement by means of the organic resin insulating layer, etc.

The present inventors have considered that when a mechanical force is applied to the metal conductor layer by cutting using a cutting machine, the structure of the metal conductor layer changes to increase the break strength. Thus, the following experiment was carried out:

An electrolytical copper foil having a thickness of 35 μm and a break strength of 32.3 $Kgf/mm^2$ was cut by means of a cutting machine so as to give a definite thickness, followed by measuring its break strength. As a result, it has been found that, as shown below in Table 1, the larger the quantity of the foil cut i.e. the less its thickness, the higher the break strength.

TABLE 1

Change in the break strength brought about by cutting an electrolytical copper foil

| No. of experiment | Thickness after cut (μm) | Break strength ($kgf/mm^2$) | Amount of break strength increased ($kgf/mm^2$) |
|---|---|---|---|
| Blank | 35 | 32.3 | — |
| 1-1 | 30 | 36.0 | 3.7 |
| 1-2 | 25 | 40.8 | 8.5 |
| 1-3 | 20 | 45.5 | 13.2 |
| 1-4 | 18 | 48.3 | 16.0 |
| 1-5 | 15 | 53.3 | 21.0 |
| Compar. ex. | 25 | 32.5 | 0.2 |

As a comparative example, an experiment of reducing the thickness of the above electrolytic copper foil down to 25 μm by uniformly etching the total surface thereof was carried out. As a result, no increase in the break strength was observed.

According to the surface measurement by way of X-way diffraction, it was found that in the case of any of the cut electrolytic copper foils, the reflection on the face (111) became stronger, while those on the surfaces (200) and (220) become weaker, as compared with the blank electrolytic copper foil, that is, a selective alignment of the crystal surface occurred, and also it was presumed that the crystal particle and the crystal particle size were reduced; thus, it is considered that the selective alignment of the crystal surface and the changes in the crystal particle and the crystal particle size contribute greatly to the increase in the break strength.

The same experiment as in Table 1 was carried out using a 426 alloy foil having a thickness of 50 μm and a break strength of 56.2 $Kgf/mm^2$. As a result, it was confirmed that the break strength increases with reduction in the thickness after cutting, as shown in Table 2.

TABLE 2

Change in the break strength brought about by cutting a 426 alloy foil

| No. of experiment | Thickness after cut (μm) | Break strength ($kgf/mm^2$) | Amount of break strength increased ($kgf/mm^2$) |
|---|---|---|---|
| Blank | 50 | 56.2 | — |
| 2-1 | 40 | 62.1 | 5.9 |
| 2-2 | 35 | 68.4 | 12.2 |
| 2-3 | 30 | 73.8 | 17.6 |

According to the above experiments, we have found that the break strength of the metal conductor layer is increased by cutting the layer; thus the resulting material was applied to a device for a film carrier and the following Examples were carried out.

EXAMPLE 1

To a mixture of p-phenylenediamine with diaminodiphenyl ether (molar ratio: 7/3) dispersed in N-methylpyrrolidone was added an equimolar quantity of biphenyltetracarboxylic dianhydride, followed by reacting these at room temperature for 24 hours, casting the resulting N-methylpyrrolidone solution of a polyimide precursor on an electrolytic copper foil of 35 μm thickness, heating the resulting material at 150° C. for one hour to vaporize and drive off N-methylpyrrolidone, raising the temperature up to 350° C. over 30 minutes, and heating the resulting material as it was for one hour to complete the imidization reaction; thus, a film carrier body of a two-layer structure having a polyimide layer of 40 μm was obtained.

A device hole of 6 mm square was opened in the film carrier body of a two-layer structure by means of a numerical control, cutting machine, and at the same time, the electrolytic copper foil was also cut. The thickness of the electrolytic copper foil inside the device hole after the processing was made 20 μm.

The resulting film carrier body having the device hole opened was subjected to lithographic technique and etching treatment with a $CuCl_2$ solution, followed by subjecting the resulting material to non-electrolytic tin-plating to obtain a film carrier. This film carrier had 100 inner leads an inner lead pitch of 160 μm, an inner lead width of 55 μm, an inner lead thickness of 19 μm and a thickness of tin-plating of 0.5 μm.

L.S.I. chips having 100 gold-made, projected electrodes of 100 μm square were registered with the above film carrier body, followed by carrying out gang bonding at 450° C. for one second to obtain a sample for measuring the strength of the inner leads.

The strength of the inner leads was measured by means of a pull tester. As a result, all of the breakages were of cut mode of inner leads, and its strength was 28 g/lead on average.

COMPARATIVE EXAMPLE 1

A device hole of 6 mm square was opened in the film carrier body used in Example 1, using a numeral control processing machine, so as not to damage the electrolytic copper foil, followed by subjecting the resulting material to uniform etching treatment in a $CuCl_2$ solution so as to give a thickness of the electrolytic copper foil of 20 μm, and obtaining a film carrier in the same manner as in Example 1, using the above obtained film carrier body having the device hole opened.

This film carrier had 100 inner leads, an inner lead pitch of 160 μm, an inner lead width of 57 μm, an inner lead thickness of 19.5 μm and a tin-plated thickness of 0.5 μm.

Gang bonding was carried out using the same L.S.I. chips as in Example 1 and under the same conditions as in Example 1, followed by measuring the inner lead strength of the resulting sample by means of a pull tester. All of the breakages were of a cut mode of inner leads and the strength was 22 g/lead on average.

EXAMPLE 2

An electrolytic copper foil of 35 μm thickness having a break strength of 32 $Kgf/mm^2$ was laminated onto a commercially available polyimide tape (polyimide: Ubilex® made by Ube Kosan Co., Ltd.; 75 μm thick) having an adhesive applied thereonto to obtain a film carrier body of a three-layer structure, followed by opening a device hole of 6 mm square in the body by means of a numeral control, cutting machine and at the same time, cutting the electrolytic copper foil, too. The thickness of the electrolytic copper foil inside the device hole after processing was made 19 μm.

The resulting film carrier body having the device hole opened was treated in the same manner as in Example 1 to obtain a film carrier. This film carrier had 100 inner leads, an inner lead pitch of 160 μm, an inner lead width of 56 μm, an inner lead thickness of 17 μm and a tin-plated thickness of 0.4 μm.

Gang bonding was carried out using the same L.S.I. chips as in Example 1 and under the same conditions as in Example 1 to obtain a sample for measuring the strength of the inner lead. According to the pull test, all of the breakages were of cut a mode of inner leads, and its strength was 26 g/ lead on average.

COMPARATIVE EXAMPLE 2

A device hole was opened in the same polyimide tape of 6 mm square as in Example 2, followed by laminating an electrolytic copper foil of 18 μm thickness having a break strength of 34 $Kgf/mm^2$ and treating the resulting film carrier body of a three-layer structure having the device hole opened therein in the same manner as in Example 1, to obtain a film carrier.

This film carrier had 100 inner leads, an inner lead pitch of 160 μm, an inner lead width of 60 μm, an inner lead thickness of 17 μm and a tin-plated thickness of 0.4 μm. Gang bonding was carried out using the same L.S.I. chips as in Example 1 and under the same conditions as in Example 1, followed by measuring the inner lead strength of the resulting sample by a pull tester. All of the breakages were of cut mode of inner leads and its strength was 20 g/ lead on an average. Effectiveness of the Invention As described above in details, according to the process of the present invention, a metal conductor layer of a small thickness is formed without employing a selective etching treatment needing a cumbersome lithographic step which is long and inferior in economy and without using an alloy-calendered copper foil which is accompanied with restriction to the design of the film carrier and is expensive, and also without causing any shortcircuit between wiring patterns at the time of patterning, whereby it has become possible to produce a film carrier having a sufficient lead strength.

What we claim is:

1. A process for producing a film carrier having a superior lead strength, which comprises removing from the body of a film carrier of a two-layer structure consisting of a metal conductor layer and an organic resin insulating layer, a definite portion of said insulating layer by means of a cutting machine to form an opening part, and at the same time, cutting a portion of said metal conductor layer as the lower layer of said opening part to reduce the thickness of said metal conductor layer of the lower layer of the opening part.

2. A process for producing a film carrier having a superior lead strength according to claim 1, wherein said organic resin insulating layer is a polyimide resin insulating layer.

3. A process for producing a film carrier having a superior lead strength, which comprises removing from the body of a three-layer structure obtained by applying a metal conductor layer onto an organic resin insulating layer by the medium of an adhesive layer, definite portions of said organic resin insulating layer and said adhesive layer as the lower layer of said organic resin insulating layer, by means of a cutting-processing machine to form an opening part, and at the same time, cutting a portion of the lower layer of said metal conductor layer to reduce the thickness of the metal conductor layer of the lower layer of said opening part.

4. A process for producing a film carrier having a superior lead strength according to claim 3, wherein said organic resin insulating layer is a polyimide resin, polyethylene terephthalate resin or glass-reinforced resin insulating layer, and said adhesive layer is an epoxy, urethane, acrylic, methacrylic or isocyanate adhesive layer.

* * * * *